Figure 1:
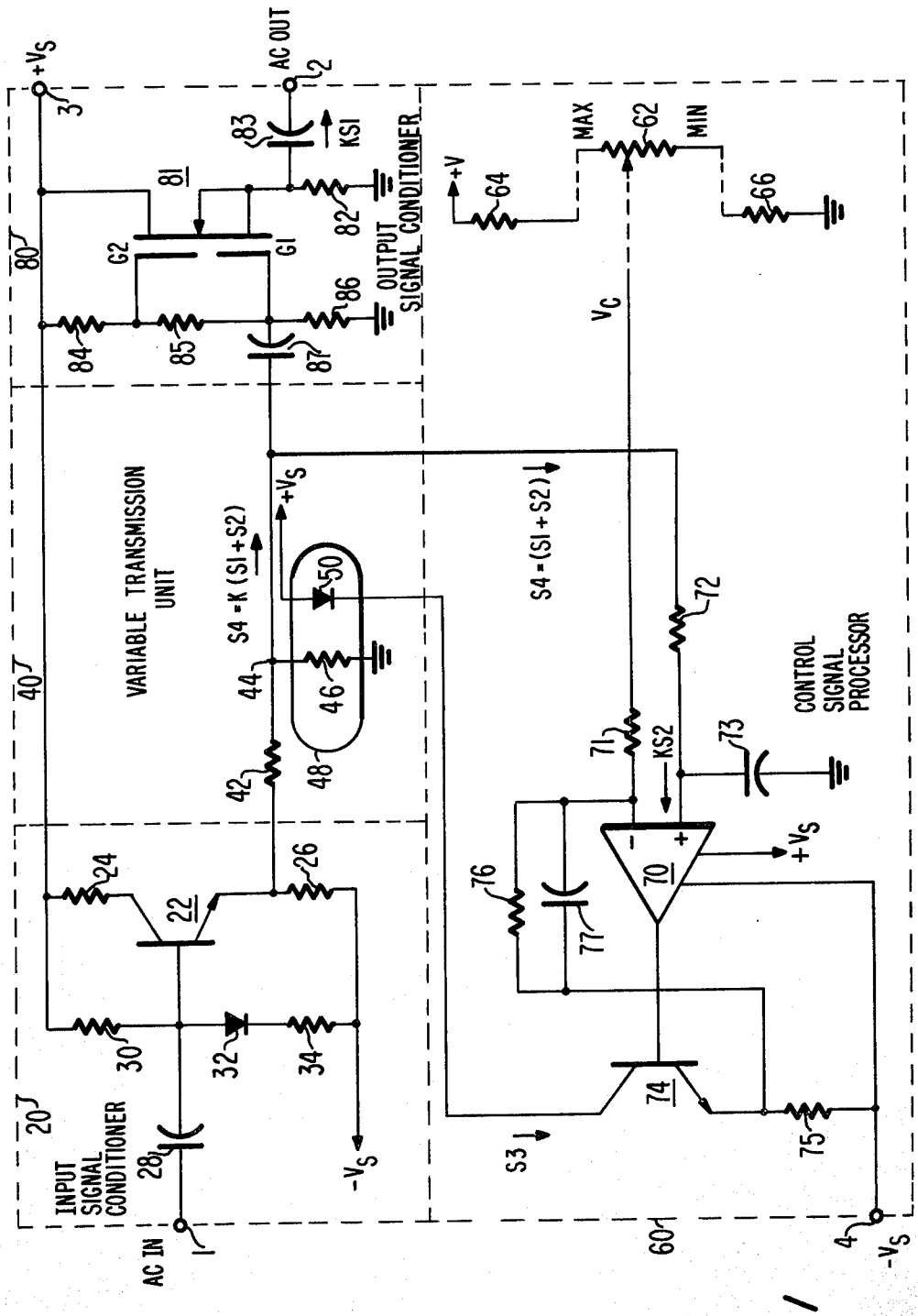

United States Patent [19]

Goldberg

[11] Patent Number: 4,468,631
[45] Date of Patent: Aug. 28, 1984

[54] AMPLITUDE CONTROL APPARATUS

[75] Inventor: Selwyn B. Goldberg, Princeton, N.J.

[73] Assignee: RCA Corporation, New York, N.Y.

[21] Appl. No.: 381,621

[22] Filed: May 24, 1982

[51] Int. Cl.³ .............................................. H03G 3/30
[52] U.S. Cl. .................................... 330/284; 330/278
[58] Field of Search .................. 330/86, 278, 282, 284

[56] References Cited

U.S. PATENT DOCUMENTS 3,720,880  3/1973  Le Seigneur ........................ 330/282

OTHER PUBLICATIONS

J. G. Graeme "Applications of Operational Amplifiers–Third Generation Techniques" McGraw-Hill Book Co., 1973, pp. 97–102.

*Primary Examiner*—James B. Mullins
*Assistant Examiner*—G. Wan
*Attorney, Agent, or Firm*—E. M. Whitacre; P. J. Rasmussen; R. G. Coalter

[57] ABSTRACT

The DC component of an input signal is regulated at a constant amplitude to provide a resultant signal that is coupled to an output node via variable transmission means to provide a processed output signal. Feedback control means, coupled to the variable transmission means, regulates the DC component of the processed output signal linearly in accordance with the amplitude of a gain control signal thereby providing corresponding linear changes in the amplitude of the AC component of the processed output signal without need for linear transmission elements in the variable transmission means.

3 Claims, 2 Drawing Figures

AMPLITUDE CONTROL APPARATUS

This invention relates to electrical apparatus and particularly to apparatus for electrically controlling the amplitude of an alternating current signal.

Numerous applications exist where it may be desired to provide remote control of the amplitude of alternating current (AC) signals (e.g., audio or radio frequency signals). It is known to use current or voltage controlled resistive elements (e.g., photo-resistors, photo-transistors, field-effect transistors, etc.) for such purposes. However, with such devices the resistance is generally not a linear function of the control signal. Heretofore, the problem of non-linearity of the control device has been solved by applying a common control signal to a pair of essentially identical or "matched" controllable resistive elements. One element is interposed in the signal path to be controlled and the other element is connected in the feedback path of an operational amplifier which supplies a common control signal to both of the elements. The feedback signal is negative and linearizes the resistance characteristics of both resistive elements with respect to variations of a control signal applied to the operational amplifier. Examples of such arrangements for use with both photo-sensitive resistors and field effect transistors are described in detail in the textbook "Applications Of Operational Amplifiers, Third Generation Techniques" by J. G. Graeme, published by McGraw-Hill Book Company in 1973. See, particularly, pages 97–102.

As noted by Graeme, the accuracy (linearity) of photo-transistor or FET gain control circuits is essentially determined by the degree of matching of the elements and the accuracy with which their characteristics track each other over a desired operating range. As long as they track, the variable resistance elements can exhibit a non-linear resistance characteristic and the feedback loop will linearize the dependence on the control signal as previously noted. With matched photoresistors, for example, linearity errors on the order of one or two percent have been obtained.

The present invention is directed to meeting the need for amplitude control apparatus having a substantially improved linearity versus control signal characteristic and which does not require the use of control devices having matched or similar characteristics.

Amplitude control apparatus embodying the invention includes an input means for receiving an input signal and providing a resultant signal inclusive of a first component proportional to said input signal and a second component having a substantially constant amplitude. A variable transmission means, responsive to the resultant signal, provides a processed output signal of controllable amplitude. A feedback control means, coupled to the variable transmission means, regulates the amplitude of the second component of the processes output signal at a predetermined level that is substantially independent of the amplitude of the input signal.

In accordance with a further aspect of the invention, the apparatus includes an output terminal and an output means for coupling the first component of the processed output signal to the output terminal to the substantial exclusion of the second component of the processed output signal.

Figure 2:
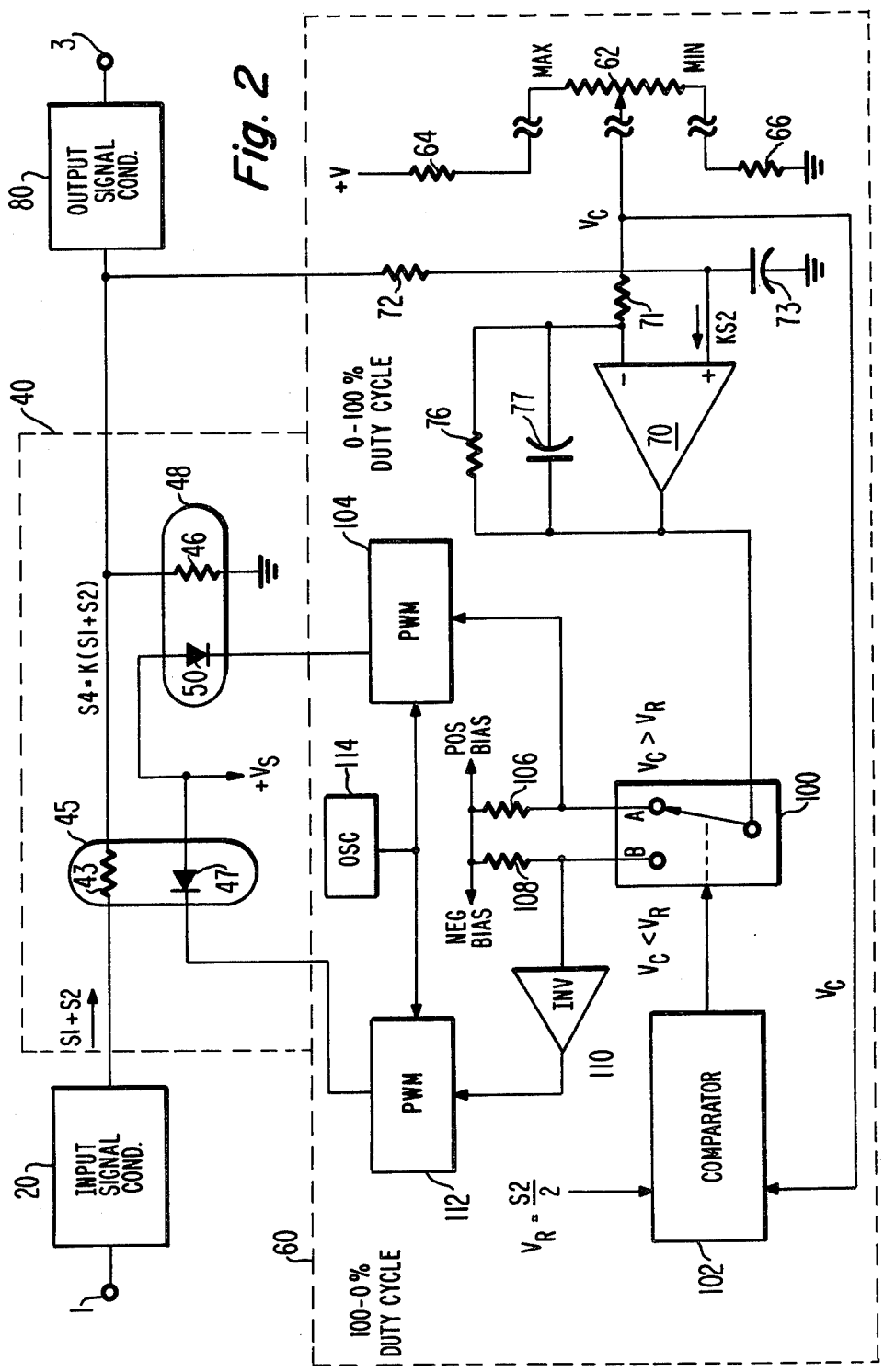

IN THE DRAWINGS:

FIG. 1 is a schematic diagram, partially in block form, of amplitude control apparatus embodying the invention; and FIG. 2 illustrates certain modifications of the apparatus of FIG. 1.

The apparatus of FIG. 1 provides remote control of the amplitude of an alternating current (AC) signal in response to the level of a direct current (DC) control voltage and features exceptionally wide bandwidth capability (several MHz for this specific embodiment) and improved linearity characteristics. For ease of illustration and discussion, the apparatus has been divided into four functional section (outlined in phantom) in the drawing. They are: an input signal conditioner 20; a variable transmission unit 40; a control signal processor 60; and an output signal conditioner 80.

Input signal conditioner 20 includes an emitter follower transistor 22 having collector and emitter electrodes coupled via resistors 24 and 26 to respective ones of power supply terminals 3 and 4 and a base electrode coupled to an AC signal input terminal 1 via a capacitor 28. The base of transistor 22 is coupled to supply terminal 3 (for receiving a positive supply voltage, +Vs) via a resistor 30 and to supply terminal 4 (for receiving a negative supply voltage, −Vs) via the series connection of a diode 32 and a resistor 34.

The function of conditioner 20 is to form a resultant signal (at the emitter of transistor 22) having an AC component S1 proportional to the magnitude of the AC input signal at terminal 1 and a DC component S2 of substantially constant amplitude. Component S2 is independent of any DC component of the AC input signal because of the blocking or high-pass filtering action of capacitor 28. The value of component S2 is determined mainly by the supply voltages applied to terminals 3 and 4 and the values of resistors 30 and 34 of 8500 and 13000 Ohms, respectively, component S2 will be about 2 volts positive with respect to ground potential. Component S1 of the resultant signal will be substantially equal to the AC input signal at terminal 1 since the gain of the emitter follower is substantially unity. It will be appreciated that transistor 22 may be amplifier in which case the AC component S1 of the resultant signal (S1+S2) will be greater than (but proportional to) the magnitude of the AC input signal at terminal 1.

Variable transmission unit 40 comprises a resistor 42 coupled between the emitter of transistor 22 and a circuit node 44 which, in turn, is coupled to ground via the light dependent resistor 46 of an optical isolator 48. Resistor 46 is optically coupled to a light emitting diode (LED) 50 in isolator 48. The anode of LED 50 is coupled to the positive supply voltage source (terminal 3) and the LED cathode is coupled to receive a feedback signal, S3, provided by processor 60 as will be described.

The function of unit 40 is to receive the resultant signal S1+S2 and provide a processed output signal, S4, (at node 44) of controllable amplitude. Specifically, the processed output signal is of the form K(S1+S2) where K is a variable controlled by processor 60. In this specific example of the invention resistors 42 and 46 are connected as a voltage divider or an attenuator. The value of K (to a good approximation, neglecting stray capacitance and node loading effects) is proportional to R46/(R64+R42) where R46 is the value of resistor 46 and R42 is the value of resistor 42. For an optical isolator, such as the model CLM 6500, the dark resistance (LED 50 fully on) is about 300 Ohms. From the foregoing relationship and assuming a value of 2200 Ohms for resistor 42, the maximum value of K is substantially unity and the minimum value is approximately 0.12. The minimum value of K may be made smaller thereby providing a greater gain control range by various means, such as, increasing the value of resistor 42, decreasing the value of resistor 46 below 300 Ohms, by cascading attenuator sections or, as will be described subsequently, by using two optical isolators connected in a series-shunt relationship.

Control signal processor 60 is coupled to unit 44 to supply a negative feedback signal S3 to LED 50 from output node 44 for regulating the amplitude of the second component (KS2) of the processed output signal at a predetermined level that is substantially independent of the amplitude of the AC input signal and proportional to the value of a control voltage, Vc. The control voltage Vc is produced by a potentiometer 62 coupled between supply terminal 3 and ground via resistors 64 and 66, respectively. Potentiometer 62 may be remotely located from the remainder of processor 60 as indicated by broken lines. The resistance values are selected to provide a maximum value for Vc substantially equal to the DC component (S2) of the resultant signal (S1+S2) produced at the emitter of transistor 22 and a minimum value for Vc substantially equal to the minimum value of the DC component (KS2) of the processed output signal (S4) at node 44. Suitable resistance values are 13 k-Ohms for resistor 64, 2.5 k-Ohms for potentiometer 62 and 200 Ohms for resistor 66. With these values, Vc varies between 0.15 and 2.0 volts which corresponds to a gain range of about 0.12 to unity (about 18.4 dB).

Regulation of the gain variable, K, in proportion to control voltage Vc is provided by means of differential amplifier 70 (e.g., a type 3140 operational amplifier) having an inverting input (−) coupled via resistor 71 to the wiper of potentiometer 62 and a non-inverting input (+) coupled to node 44 via a resistor 72 and to ground via a capacitor 73. The value of resistor 71 is relatively high (e.g., 100 k-Ohms) as compared with the output impedance at the wiper of potentiometer 62 to prevent loading of the control voltage source which, otherwise, could result in a non-linear relationship between the gain variable K and the setting of potentiometer 62. Resistor 72 and capacitor 73 form a low pass filter which effectively removes the component KS1 from the processed output signal S4 (values of 1 M-Ohm and 300 pico-Farads are suitable for RF attenuator applications).

Amplifier 70 compares signals KS2 and Vc and produces an error voltage representative of the difference therebetween. The error voltage is applied to the base of an emitter follower transistor 74 having an emitter electrode coupled to the negative supply terminal 4 via a load resistor 75 (e.g., 430 Ohms) and coupled to the inverting input terminal of amplifier 70 via a parallel RC feedback network comprising resistor 76 and capacitor 77. Thus connected, transistor 74 functions as a voltage-to-current converter (VIC) producing a collector current directly proportional to the error voltage produced by amplifier 70 and inversely proportional to the value of resistor 75. Capacitor 77 integrates or smoothes the error voltage and is selected in conjunction with resistor 76 to provide a relatively long smoothing time constant of about 0.2 seconds. Suitable values for resistor 76 and capacitor 77 are 2M-Ohms and 0.1 micro-Farad, respectively.

The collector current S3 of transistor 74 is applied to the cathode of diode 50 thereby forming a closed feedback path for amplifier 70 which regulates the value of KS2 to be substantially equal to the control voltage Vc. For example, if KS2 is greater than Vc, then the error voltage will increase thereby causing transistor 74 to supply increased current to LED 50. This, in turn, will cause the value of resistor 46 to decrease until the component KS2 becomes equal to Vc. Conversely, if KS2 is less than Vc, then amplifier 70 will bias transistor 74 to supply decreased current to LED 50 thereby decreasing the attenuation of signal S4 and increasing the value of the DC component KS2 until equality with the control voltage Vc is reached.

Output signal conditioner 80 comprises a source follower connected dual gate N-channel depletion mode MOSFET transistor 81 having a drain electrode connected to supply terminal 3 and a source electrode coupled to ground via a source resistor 82 and to AC output terminal 2 via a DC blocking capacitor 83. The gate electrodes of transistor 81 are biased by a relatively high impedance network comprising resistor 84 coupled between terminal 3 and gate G2, resistor 85 coupled between gates G2 and G1 and resistor 86 coupled between gate G1 and ground. Representative resistance values for a type 3N140 transistor are 300 Ohms, 510 K-Ohms, 390 K-Ohms and 240 k-Ohms, respectively, for resistors 82, 84, 85 and 86. Gate G1 is coupled to the output node 44 of unit 40 via a DC blocking capacitor 87 of substantially larger capacitance (e.g., several hundred pico-Farads) than the gate input capacitance of transistor 81 (typically, 5 pico-Farads).

The purpose of conditioner 80 is to couple the AC component KS1 of the processed output signal S4 to output terminal 2 to the substantial exclusion of the DC component (KS2) of the processed output signal and to provide output impedance reduction. Since component KS2 is modulated only to the extent that Vc varies, and Vc is filtered by capacitor 77, one may consider KS2 to be essentially a DC signal and thus it is blocked by capacitor 87 so that only the component KS1 reaches the gate of transistor 81. The DC bias at the source of transistor 81 is prevented from reaching output terminal 2 by capacitor 83. Since transistor 81 provides high-to-low impedance transformation, capacitor 83 may be of a relatively high value (e.g., 0.68 micro-Farad).

Considering now the overall AC transfer function of the RF attenuator of FIG. 1, the lower frequency limit of operation is essentially a fixed value determined by the time constants of the coupling capacitors and bias networks for transistors 22 and 81. However, the upper frequency response limit is not fixed but varies to a certain extent with the setting of potentiometer 62 as now explained. Assume first that potentiometer 62 is at its maximum setting (Vc=2volts). For this condition, amplifier 70 will bias transistor 74 to supply a minimum current to LED 50 so that the value of resistor 46 will increase until the condition KS2=Vc is met (as previously explained). This condition corresponds to essentially zero attenuation or unity gain in unit 40 and the value of resistor 46 will be very large as compared with that of resistor 42. As a result, the output resistance, Ro, at node 44 will be substantially determined only by the value of resistor 42 (assumed to be 2200 Ohms). The input capacitance, Ci, of conditioner 80 is essentially equal to the gate capacitance of transistor 81 (5 pF, assumed) and, in combination with the output resistance of unit 40, forms a low pass filter having a cut-off or corner frequency of about 14.5 MHz for the assumed values.

Assume now that potentiometer 62 is changed to its minimum setting. Amplifier 70 will supply increased current to LED 50 until the value of resistor 46 decreases to a level where KS2=Vc (about 0.15 volts). In this minimum gain condition, the value of resistor 46 will be very low (e.g., 300 Ohms or so) and the output resistance Ro of unit 40 will decrease from 2200 Ohms to about 264 Ohms. Since the input capacitance of unit 80 is fixed or constant, the decrease in Ro will have the effect of increasing the bandwidth from 14.5 M-Hz to about 120 M-Hz (still neglecting stray capacitance, lead inductance effects, etc.). This corresponds to a change in bandwidth of the RF attenuator of over 8:1 for the extreme settings of potentiometer 62.

In FIG. 2, unit 40 and processor 60 have been modified to (1) increase the gain control range and (2) to decrease the dependence of the system bandwidth on the control voltage Vc. Specifically, in unit 40, resistor 42 has been replaced by light dependent resistor 43 of a further optical isolator 45 having a LED 47 connected at the anode thereof to receive the positive supply voltage, +Vs. Unit 60 has been modified by deleting transistor 74 and resistor 75 and connecting resistor 76 and capacitor 77 directly between the inverting input terminal and the output terminal of amplifier 70. The output of amplifier 70 is connected to the input of a single-pole two-position switch 100 controlled by a comparator 102 which compares the control voltage Vc with a fixed reference voltage Vr equal to one half of the DC component S2 of the Resultant signal S1+S2. Pole A of switch 100 is coupled to the input of a pulse width modulator 104 and via a resistor 106 to a source of positive bias (not shown). Pole B of switch 100 is coupled via a resistor 108 to a source of negative bias and via an inverter 110 to the input of a further pulse width modulator 112. Pulse width modulators 104 and 112 receive input pulses from a common oscillator 114 and supply duty cycle modulated output current pulses to the cathodes of respective ones of LED's 50 and 47. The frequency of oscillator 114 is selected to be greater than the optical time constant of isolators 45 and 48 to prevent modulation of the processed signal S4 by the LED current pulses.

In operation, elements 62–77 function as previously described to provide an error voltage at the output of amplifier 70 proportional to the difference between Vc and KS2. The value of resistor 66 (which sets the minimum gain, K) may be made much smaller than in the example of FIG. 1 since both the series and the shunt branch resistors 43 and 46 of the attenuator formed by isolators 45 and 48 are variable. This greatly extends the overall attenuation range of the system. As an example, by selecting a value of zero Ohms for resistor 66, essentially complete attenuation of the AC signal component S1 is possible. Moreover, the control of LED's 47 and 50 is such that one LED is always at maximum brilliance (100% duty cycle) for any setting of potentiometer 62. As a result, the output resistance Ro of transmission unit 40 is very low and is substantially constant varying, at most, by a factor 2:1 over the full gain control range of the attenuator. The reduction and stabilization of Ro greatly increase the overall effective usable bandwidth of the amplitude control apparatus.

In more detail, assume first that the control voltage is at its maximum value of 2 volts (Vc=S2). In this case, comparator 102 will place switch 100 in position A. The negative bias applied to the input of inverter 110 via resistor 108 will cause inverter 110 to supply a high level signal to modulator 112 which, in turn, will supply 100% duty cycle current pulses to LED 47. This will cause resistor 43 to assume a minimum value, illustratively, of 300 Ohms. Simultaneously, the error voltage produced by amplifier 70 will be coupled to modulator 104 via switch 100. The feedback is such that the duty cycle of modulator 104 will decrease to essentially zero whereby the value of resistor 46 will increase to essentially an open circuit condition. When that happens, the gain factor K will be substantially unity and the output resistance Ro of unit 40 will equal the assumed minimum value (300 Ohms) of resistor 43.

Now assume that Vc is decreased to exactly one half of the value of the DC signal component S2 and that comparator 102 remains in its previous state (due to hysteresis, for example). In this condition, modulator 112 will remain at a 100% duty cycle but the duty cycle of modulator 104 will increase thereby decreasing the value of resistor 46 until the signal component KS2 equals the new value of Vc. This occurs when the resistance of resistor 46 is exactly equal to that of resistor 43 resulting in an output impedance at node 44 equal to the parallel combination of resistors 43 and 46 (i.e., 150 Ohms). This represents the minimum output resistance of unit 40.

As Vc decreases further (below one half S2) comparator 102 changes switch 100 from position A to position B. Resistor 106 biases modulator 104 to supply 100% duty cycle current pulses to LED 50 and the error voltage is inverted and applied to modulator 112 which decreases the duty cycle of modulator 112 as Vc decreases. This causes the resistance of resistor 43 to increase thereby providing additional attenuation to the processed output signal S4. In the limit, as Vc decreases, the maximum output resistance of unit 40 is determined by resistor 46 which, with 100% duty cycle current pulses supplied thereto, has an assumed minimum resistance value of 300 Ohms. Accordingly, the maximum resistance variation varies over a range from 300 Ohms at zero attenuation to 150 Ohms at 6dB of attenuation and increases again to 300 Ohms at infinite attenuation.

It will be appreciated that various changes and modifications may be made within the spirit and scope of the invention. Unit 40, for example, may be implemented with other suitable elements of controllable impedance. Unit 80 may be omitted, for example, in applications where the presence of the variable DC component S2 is not objectionable and where the impedance transformation is not desired. Potentiometer 62 may be replaced by another suitable source of control voltage. Digital control, for example, may be facilitated by replacing potentiometer 62 with a digital-to-analog signal converter. It is desirable that series and shunt variable impedance means be included in the transmission unit 40 as shown in FIGURE 2. It is not necessary, however, that the impedance means be operated over mutually exclusive operating ranges as shown, however. Specifically, at a sacrifice in output resistance stability, the series and shunt impedance means may be varied simultaneously over the full attenuation range of the amplitude control apparatus rather than being varied over mutually exclusive portions of the control range. Rather than using a single capacitor for removing the low-frequency portion of the input signal, the input signal conditioner may include a multi-element filter.

What is claimed is:

1. Amplitude control apparatus, comprising: input means for receiving an input signal and providing a resultant signal inclusive of an AC component proportional to amplitude variations of said input signal and a DC component of constant amplitude;
   an output node for providing a processed output signal;
   attenuator means having a series branch for coupling said resultant signal to said output node and a shunt branch for coupling said output node to a point of reference potential, each branch including an impedance element; and
   feedback control means having a first input coupled to said output node, a second input coupled to receive a gain control signal and an output for supplying a feedback control signal to at least one of said impedance elements for regulating the amplitude of the DC component of said processed output signal in accordance with the amplitude of said gain control signal.

2. Amplitude control apparatus as recited in claim 1 wherein said feedback control means includes first filter means for separating said DC component from said processed output signal, differential amplifier means for developing a feedback signal from the separated DC component and said gain control signal, second filter means for smoothing said feedback signal and coupling means for coupling the smoothed feedback signal to said at least one impedance element.

3. Amplitude control apparatus as recited in claim 2 further comprising means for applying said smoothed feedback control signal to the impedance element of each branch in a sense to minimize output impedance variations at said output node.

* * * * *